US007836599B2

(12) United States Patent
Taira

(10) Patent No.: US 7,836,599 B2
(45) Date of Patent: Nov. 23, 2010

(54) INK JET HEAD AND METHOD OF MANUFACTURING THEREOF

(75) Inventor: Hiroshi Taira, Ichinomiya (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 457 days.

(21) Appl. No.: 11/317,288

(22) Filed: Dec. 27, 2005

(65) Prior Publication Data

US 2006/0139415 A1 Jun. 29, 2006

(30) Foreign Application Priority Data

Dec. 28, 2004 (JP) ............................ 2004-380147

(51) Int. Cl.

| | |
|---|---|
| ***B23P 17/00*** | (2006.01) |
| ***B21D 53/76*** | (2006.01) |
| ***H01L 41/22*** | (2006.01) |
| ***H04R 17/00*** | (2006.01) |
| ***B41J 2/045*** | (2006.01) |

(52) U.S. Cl. ...................... 29/890.1; 29/25.35; 347/70; 347/71

(58) Field of Classification Search ................ 29/25.35, 29/890.1; 347/70, 71

See application file for complete search history.

(56) References Cited

U.S. PATENT DOCUMENTS 6,419,352 B1 * 7/2002 Kubota et al. ................. 347/96
6,450,618 B2 * 9/2002 Kato et al. .................... 347/54
6,502,929 B1 1/2003 Sonehara et al.

FOREIGN PATENT DOCUMENTS

| | | | |
|---|---|---|---|
| JP | 5-16373 | | 1/1993 |
| JP | 10-166599 | | 6/1998 |
| JP | 10-166599 | * | 10/1998 |
| JP | 11-334087 | | 12/1999 |
| JP | 2003-145778 A | | 5/2003 |

OTHER PUBLICATIONS

Kunihiro et al; English machine translation of Japanese patent H10-166599 (Oct. 1998).*

Japanese Patent Office, Notification of Reasons for Rejection in Japanese patent application No. 2004-380147 (counterpart to the above-captioned U.S. Patent Application) mailed Dec. 9, 2008 (partial translation).

* cited by examiner

*Primary Examiner*—A. Dexter Tugbang
*Assistant Examiner*—David P Angwin
(74) *Attorney, Agent, or Firm*—Baker Botts L.L.P.

(57) ABSTRACT

When all metal plates for forming a passage unit of an ink jet head are bonded together by metal bonding, a top metal plate will warp, and an actuator unit cannot be fitted in a uniform manner to this warped top metal plate, and if the actuator units are not fitted in a uniform manner to the top metal plate, a uniform amount of ink cannot be discharged from nozzles of the ink jet head. To deal with this, metal diffusion bonding of the metal plates is performed without the top metal plate being included therein, and the top metal plate is then caused to adhere by means of adhesive. There is thus no warping of the top metal plate, and consequently the actuator units can be fitted in a uniform manner to the top metal plate.

5 Claims, 13 Drawing Sheets

( a )

( b )

INK JET HEAD AND METHOD OF MANUFACTURING THEREOF

CROSS-REFERENCE TO RELATED APPLICATION

This application claims priority to Japanese Patent Application No. 2004-380147, filed on Dec. 28, 2004, the contents of which are hereby incorporated by reference into the present application.

BACKGROUND OF THE INVENTION

1. Field of the Invention

The present invention relates to an ink jet head and a method of manufacturing the ink jet head.

2. Description of the Related Art

A certain type ink jet head is manufactured by fixing a passage unit and an actuator unit.

The passage unit is provided with at least one common passage, a plurality of branching passages, a plurality of pressure chambers, and a plurality of nozzles. Ink supplied from the exterior of the passage unit is received in the common passage. The plurality of branching passages branch from the common passage. Each of the pressure chambers is formed part-way along one corresponding branching passage. Each of the nozzles communicates with an end part of one corresponding branching passage, and opens to the exterior of the passage unit. There is an equal number of branching passages, pressure chambers and nozzles.

The passage unit is composed of a stack of a plurality of metal plates. Penetrating holes, grooves, etc., are formed in each of the metal plates to be stacked. The common passage, branching passages, pressure chambers, and nozzles are formed by stacking the metal plates.

The actuator unit is provided with a plurality of actuators. There is an equal number of actuators and pressure chambers. Each of the actuators can be controlled independently.

The actuator unit is fixed to a top metal plate of the passage unit. The positions in which the actuators of the actuator unit are disposed, and the positions in which the pressure chambers of the passage unit are disposed are adjusted such that each actuator is coupled with a corresponding pressure chamber when the actuator unit is fixed to the top metal plate of the passage unit.

When one actuator is activated, the pressure increases within the pressure chamber that corresponds thereto, and ink is discharged from the nozzle communicating with this pressure chamber. The nozzle from which the ink will be discharged can be chosen by choosing which actuator to activate. The timing at which the ink will be discharged from the nozzle can be chosen by choosing the timing at which the actuator will be activated.

In order to obtain the above phenomenon, the actuator and the corresponding pressure chamber must have a positional relationship such that, when the actuator unit is fixed to the top metal plate of the passage unit, this positional relationship allows the actuator to increase the pressure within the corresponding pressure chamber when the actuator is activated.

One type of passage unit has holes formed in its top face. Each of holes has a bottom. When the actuator unit is fixed to the top face of the passage unit, each of the holes is covered by the actuator unit. These cavities form the pressure chambers. A positional relationship can be obtained such that, when an actuator is selected and activated, the pressure is increased within the pressure chamber corresponding to that actuator. With this type of passage unit, the top metal plate is provided with a plurality of penetrating holes, for forming pressure chambers.

In another type of passage unit, holes that have a bottom and form the pressure chambers are covered by a vibrating plate. The vibrating plate is a thin plate that flexibly deforms. In this case, as well, a positional relationship can be obtained such that, when an actuator is selected and activated, the pressure is increased within the pressure chamber corresponding to that actuator. With this type of passage unit, the top metal plate of the passage unit is the vibrating plate and has a flat surface.

When the ink jet head is to be manufactured, the passage unit and the actuator unit are manufactured separately. The passage unit and the actuator unit are then fixed.

The passage unit is manufactured by stacking the plurality of metal plates, as described above, and then bonding together the stacked metal plates. In order to do this, a stack of all metal plates that comprises the passage unit is provided, and this stack is heated under pressure to bond all the metal plates at one time. When the stacked metal plates are heated under pressure, the metal plates are bonded stably together by metal diffusion bonding. The passage unit can be manufactured efficiently by bonding all the metal plates that comprise the passage unit at one time.

BRIEF SUMMARY OF THE INVENTION

As described above, the passage unit can be manufactured efficiently when all the metal plates for forming the passage unit are bonded at one time. However, the present inventors discovered that minute warping of the top metal plate occurs when the stacked metal plates are bonded by being heated under pressure. When there is minute warping of the top metal plate, the actuator unit does not adhere in a uniform manner to the top metal plate when the actuator unit is to be fitted thereto. In this case, the actuator unit efficiently increases the pressure within the pressure chambers in the places where the actuator unit fits well, and the appropriate amount of ink is discharged from the nozzles communicating with those pressure chambers. However, the actuator unit does not increase the pressure sufficiently within the pressure chambers in the places where the actuator unit does not fit well, and a smaller amount of ink is discharged from the nozzles communicating with those pressure chambers. As a result, the amount of ink discharged from the nozzles of the ink jet head is not uniform. In this case, there is a problem that print quality grows worse when printing is to be performed by this ink jet head.

The present invention teaches a method of completing a passage unit in which minute warping does not occur in a top metal plate of the passage unit.

In the present invention, a method is taught of completing an ink jet head by causing an actuator unit to fit in a uniform manner to a flat top face of a passage unit.

In the present invention, an ink jet head is taught in which a passage unit and an actuator unit fit together in a uniform manner and in which there is little discrepancy in the amount of ink being discharged from nozzles.

A method of manufacturing an ink jet head according to this invention includes the following steps; preparing a stack of a plurality of metal plates; heating the stack under pressure to bond the plurality of metal plates and produce an incomplete passage unit; causing a top metal plate to adhere to the incomplete passage unit by means of an adhesive to complete the passage unit; and fixing an actuator unit to the top metal plate of the completed passage unit.

In the above method, the step is not performed of bonding all the metal plates for forming the passage unit at one time. Instead, the metal plates are bonded in a state in which at least the top metal plate is not included. Since the top metal plate is not bonded in this step, the passage unit is not complete. The incomplete passage unit is made first, and then an adhesive is used to cause the top metal plate to adhere to the incomplete passage unit.

With this method, there is no metal diffusion bonding with respect to the top metal plate, and consequently minute warping thereof does not occur. Since there is no minute warping of the top metal plate, the actuator unit can fit in a uniform manner with the passage unit. As a result, the nozzles of the ink jet head discharge a uniform amount of ink, and high printing quality is possible.

In the conventional method of manufacturing the ink jet head, all the metal plates for forming the passage unit are bonded at one time to complete the passage unit. However, in the method of manufacturing the ink jet head of the present invention, the manufacturing process is divided into two steps: the step of manufacturing the incomplete passage unit by metal diffusion bonding, and the step of causing the top metal plate to adhere to the incomplete passage unit. Although increasing the number of steps is undesirable from the viewpoint of production efficiency, it allows a high quality ink jet head to be manufactured.

In the step of manufacturing the incomplete passage unit, all the metal plates with the exception of the top metal plate may be bonded. Alternatively, all the metal plates with the exception of the top metal plate and a bottom metal plate may be bonded. If the bottom metal plate also needs to be extremely flat, both the top metal plate and the bottom metal plate may be caused to adhere to the incomplete passage unit.

As described above, the number of steps is increased in the above method of manufacturing the ink jet head. However, this problem can be solved by performing a preferred manufacturing method in which the top metal plate is caused to adhere to the passage unit simultaneously with the actuator unit being fixed to the top metal plate.

With this method, there is no increase in the number of steps for manufacturing the ink jet head, and a high quality ink jet head can be manufactured.

The present invention presents a novel ink jet head. The ink jet head of the present invention is composed of a passage unit and an actuator unit. The passage unit comprises a top metal plate and a plurality of lower metal plates. The top metal plate and the lower metal plates are stacked. The top metal plate is adhered to the lower metal plates by means of adhesive, and the lower metal plates are bonded together by metal diffusion bonding. The actuator unit is fixed to the top metal plate of the passage unit.

With the ink jet head that has this configuration, the actuator unit and the top metal plate fit together in a uniform manner. As a result, there is a uniform amount of ink discharged from the nozzles of the ink jet head, and high quality printing can be achieved.

A passage unit of another type of the present invention includes a top metal plate, a plurality of intermediate metal plates, and a bottom metal plate. The top metal plate, intermediate metal plates, and bottom metal plate are stacked. The top metal plate and the intermediate metal plates are adhered by means of adhesive, and the intermediate metal plates are bonded together by metal diffusion bonding. The intermediate metal plates and the bottom metal plate are adhered by means of adhesive.

With this ink jet head, the top metal plate and the bottom metal plate are both extremely flat, and high quality printing is realized.

DETAILED DESCRIPTION OF THE INVENTION

Figure 1:
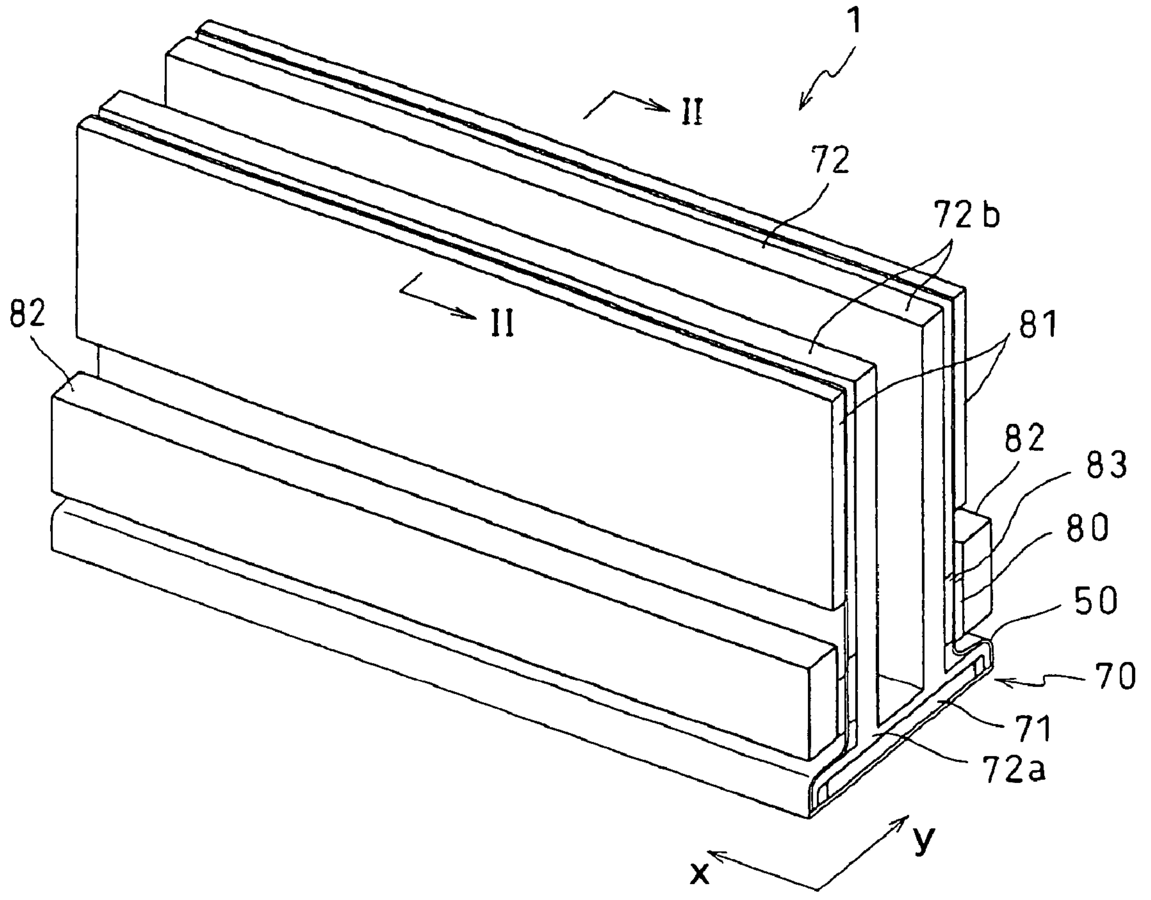
FIG. 1 shows a perspective view of an ink jet head module of a first embodiment.
Figure 2:
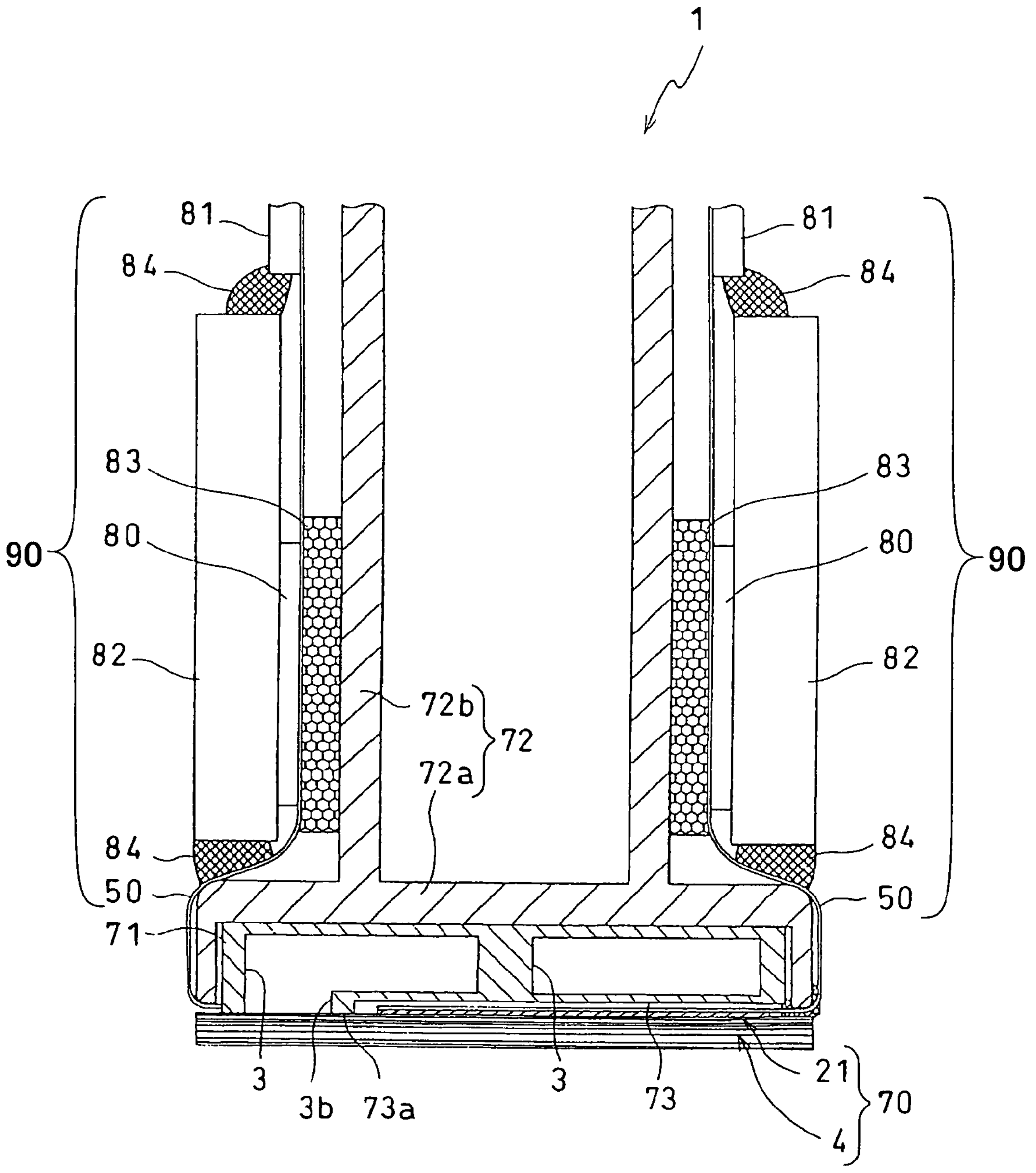
FIG. 2 shows a cross-sectional view along the line II-II of FIG. 1.

A preferred embodiment of the present invention will now be described with reference to the drawings. FIG. 1 shows a schematic perspective view of ink jet head module 1 of a first embodiment of the present invention. FIG. 2 shows a cross-sectional view along the line II-II of FIG. 1. Inkjet head module 1 is incorporated in a printing device (an ink jet printer in the present embodiment), and prints on a paper by discharging ink towards the paper being conveyed in a secondary operating direction (the y direction in FIG. 1). Ink jet head module 1 extends in a widthwise direction of the paper (the x direction of FIG. 1), and can print by discharging ink onto desired positions in the widthwise direction of the paper.

Ink jet head module 1 is composed of ink jet head 70 for discharging ink onto the paper, base block 71 for supplying ink to ink jet head 70, holder 72 to which ink jet head 70 and base block 71 are fixed, and wirings 90 (see FIG. 2) for supplying electrical signals to ink jet head 70.

Holder 72 is provided with grip portion 72*a*, and a pair of flat plate-shaped protruding portions 72*b* that extend in a perpendicular direction from grip portion 72*a*. As shown in FIG. 2, a lower face of grip portion 72*a* is formed in a concave shape. Base block 71 is fixed within the concave part of grip portion 72*a*. Ink jet head 70 is fixed to a lower side of base block 71. Wirings 90 are disposed on both outer side faces of two protruding portions 72*b*.

Base block 71 is fixed within the concave part formed at the lower face of grip portion 72*a*. Base block 71 is formed from stainless steel, and two ink reservoirs 3 are formed within base block 71. Ink reservoirs 3 are substantially rectangular parallelepiped shaped hollow regions that are formed along the lengthwise direction (the x direction of FIG. 1) of base block 71. Base block 71 has a passage (not shown) for leading ink supplied from an ink tank disposed at the exterior to ink reservoirs 3. Ten penetrating holes 3*b* are formed in lower face 73 of base block 71. Ten penetrating holes **3*b* communicate with ink reservoirs 3. Neighboring portion 73*a* of each of penetrating holes 3*b* protrudes downwards below other parts of lower face 73**.

Ink jet head 70 is fixed to base block 71 such that the upper face of ink jet head 70 faces lower face 73 of base block 71. Ten penetrating holes **3*b* are formed in positions facing ten openings 5*b* formed in ink jet head 70 (to be described). Neighboring portions 73*a* that protrude downward near penetrating holes 3*b* of base block 71 make contact with portions neighboring openings 5*b* of ink jet head 70**.

A plurality of manifolds 5 (to be described) are formed within ink jet head 70. Openings **5*b* of ink jet head 70 communicate with manifolds 5. The ink supplied from the ink tank is supplied to manifolds 5 of ink jet head 70 via ink reservoirs 3, penetrating holes 3*b*, and openings 5*b***.

Figure 13:
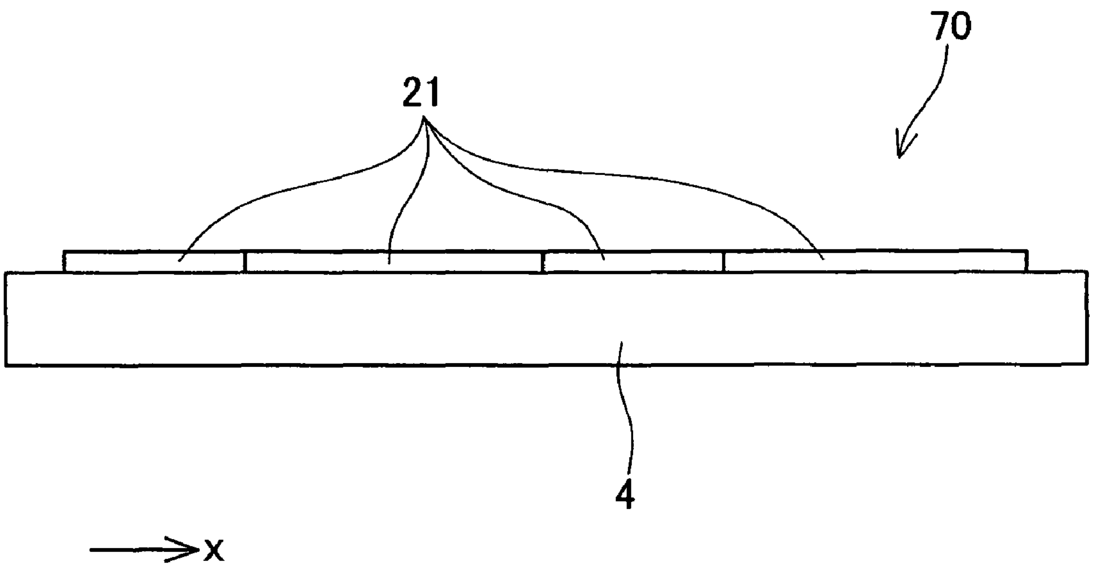
FIG. 13 is a front view of an ink jet head.

Ink jet head 70 is fixed to lower face 73 of base block 71. FIG. 13 shows a front view of ink jet head 70. As shown in FIG. 13, ink jet head 70 is composed of one passage unit 4 and four actuator units 21.

Figure 5:
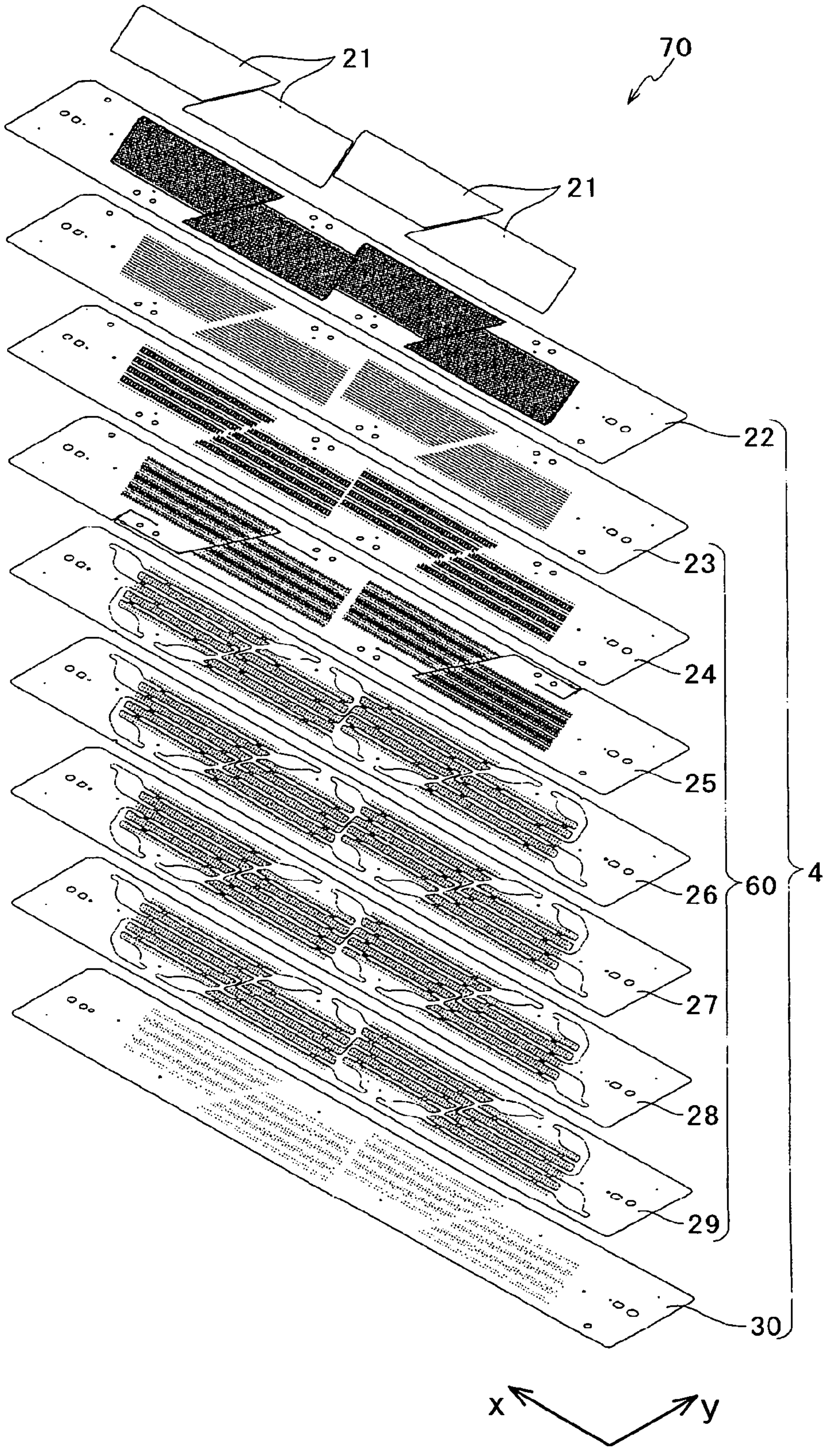
FIG. 5 is a disassembled perspective view showing a stacked state of metal plates that form a passage unit.

FIG. 5 is a disassembled perspective view of ink jet head 70. As shown in FIG. 5, passage unit 4 is composed of metal plates 22~29 and nozzle plate 30 that have been stacked. Metal plates 22~29 and nozzle plate 30 are metal plates formed from stainless steel or the like. That is, nozzle plate 30 is also a type of metal plate. A plurality of penetrating holes are formed in each of metal plates 22~29 and nozzle plate 30. Although this is not shown, a water-repellent layer consisting of fluorinated resin is formed on a lower face of nozzle plate 30. This water-repellent layer is readily affected by heat, and will be damaged if heated above a predetermined temperature. Four actuator units 21 are fixed to an upper face of metal plate 22.

Figure 3:
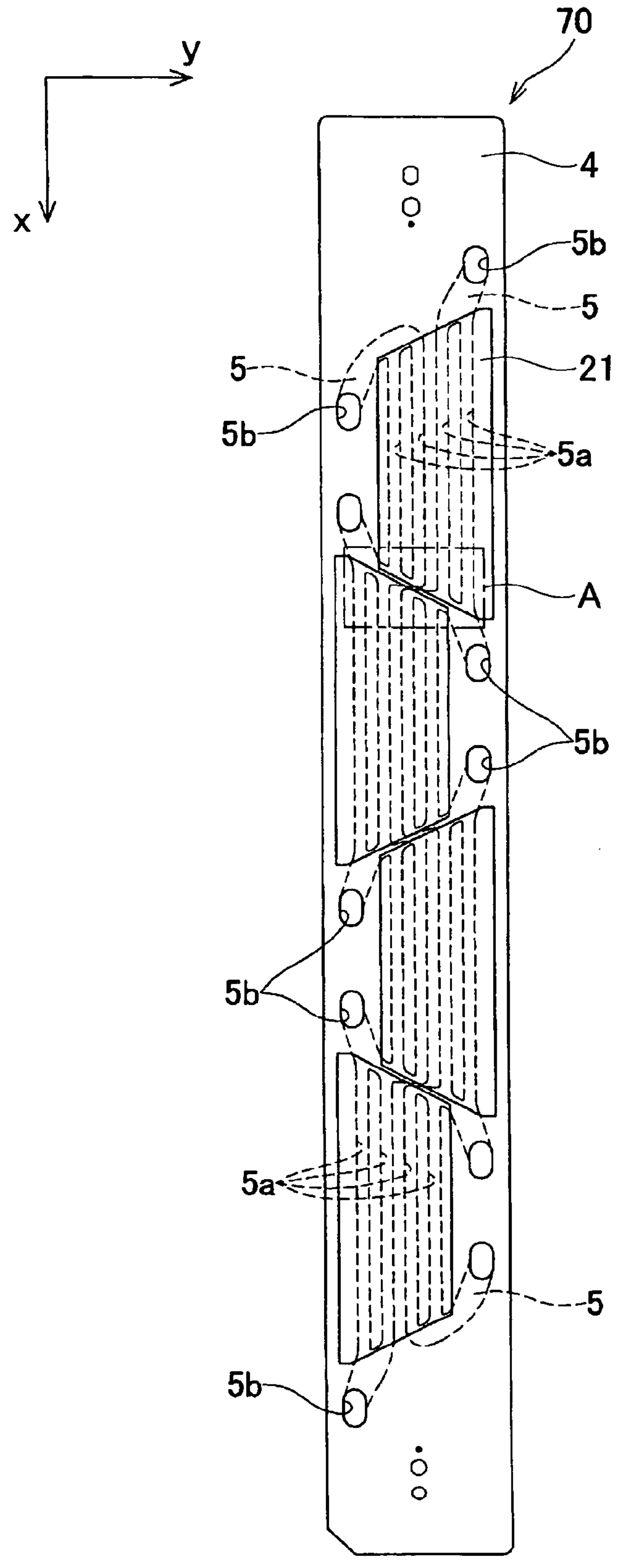
FIG. 3 shows a plan view of an ink jet head.

FIG. 3 shows a plan view of ink jet head 70. As shown in FIG. 3, ten manifolds 5 are formed from the penetrating holes formed in metal plates 22~29 and nozzle plate 30 within passage unit 4. One end of each of manifolds 5 opens into the upper face of ink jet head 70 (i.e. the upper face of metal plate 22) at a location that does not interfere with actuator units 21. The other end of each of manifolds 5 branches to form sub-manifolds **5*a*. As described above, ink is supplied from ink reservoirs 3 of base block 71 to openings 5*b* of manifolds 5. The ink supplied to manifolds 5 is supplied into sub-manifolds 5*a*. Manifolds 5 have a wide cross-sectional area up until sub-manifolds 5*a***, and pressure is the same in each part thereof, this essentially forming one common ink passage.

Figure 6:
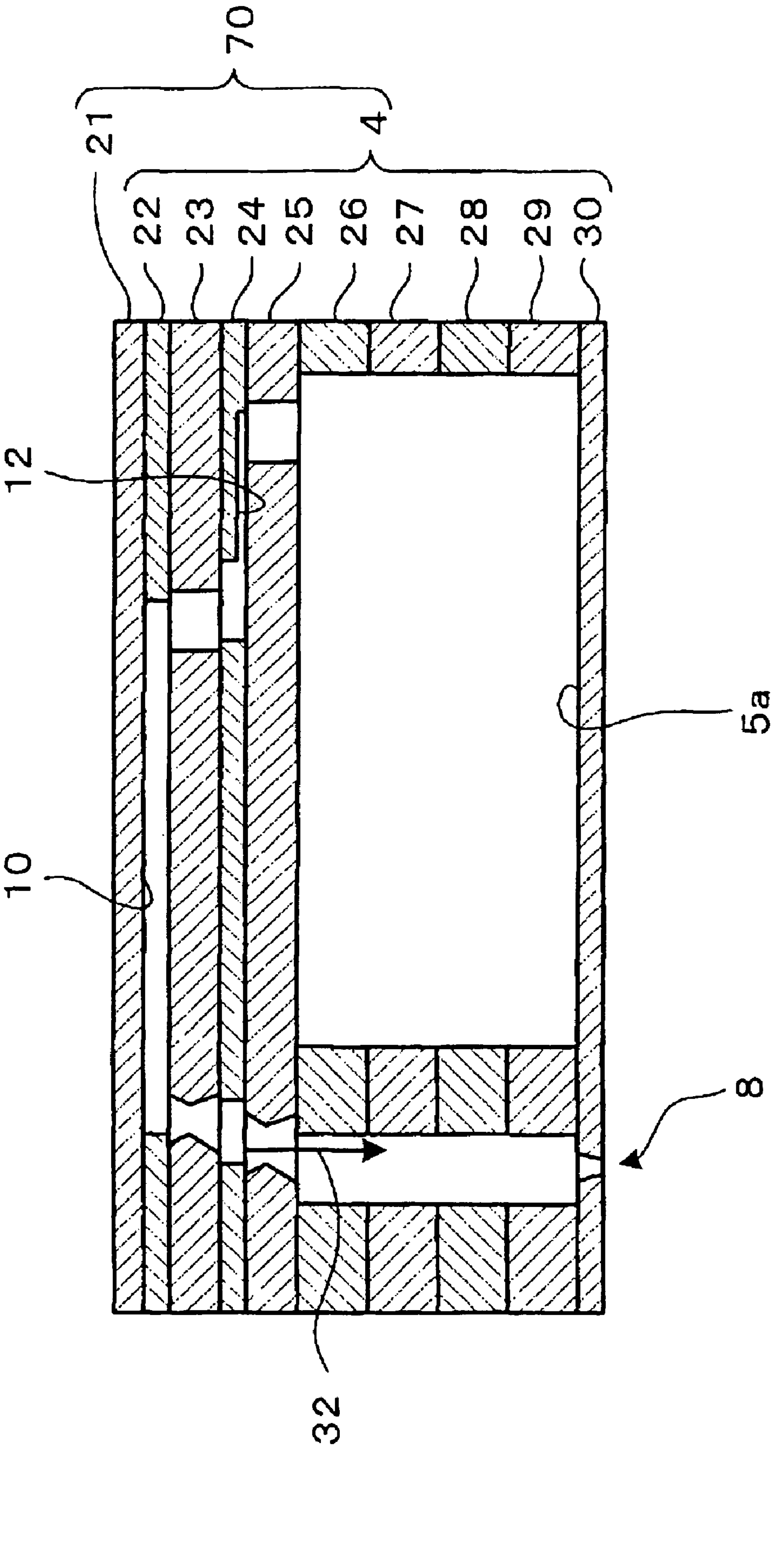
FIG. 6 shows a cross-sectional view along the line VI-VI of FIG. 4.

FIG. 6 is a cross-sectional view of ink jet head 70, and is an enlarged schematic view of one ink discharging path (a branching passage that has branched into a pressure chamber and a nozzle). As shown in FIG. 6, branching passage 32 is formed from the penetrating holes formed in metal plates 22~29 and nozzle plate 30 within passage unit 4. One end of each of branching passages 32 is connected with sub-manifolds **5*a* (the common passage), and the other end thereof is connected with corresponding nozzle 8. Branching passages 32 receive the ink supplied from sub-manifolds 5*a*, and lead this ink to nozzles 8. Nozzles 8 open into the lower face of nozzle plate 30, and discharge the ink supplied from branching passages 32. Pressure chamber 10 is formed part-way along branching passage 32. Pressure chamber 10 is formed from a penetrating hole formed in metal plate 22, and is covered by actuator unit 21. Pressure chamber 10 is filled with the ink that was supplied from sub manifold 5*a* via an upstream portion of branching passage 32. Aperture 12 is formed in branching passage 32 at the side upstream from pressure chamber 10**.

Figure 7:
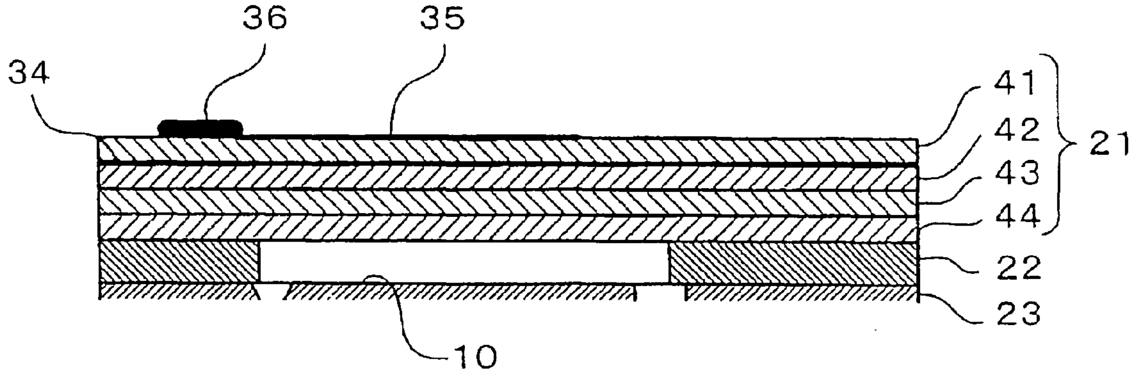
FIG. 7(*a*) shows a partially expanded cross-sectional view of an actuator unit, and FIG. 7(*b*) shows a plan view of an individual electrode and a land.
Figure 7:
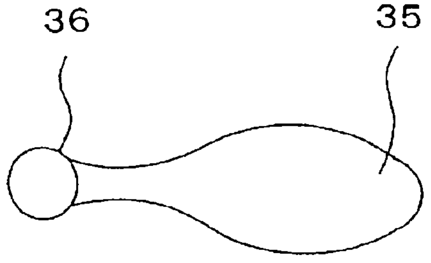

As shown in FIG. 7(*a*), actuator units 21 are fixed to the upper face of top metal plate 22 of passage unit 4. Each actuator units 21 is composed of four ceramic plates 41~44. Ceramic plates 41~44 are formed from ferroelectric ceramic material. In the present embodiment, they are formed from lead zirconate titanate (PZT) ceramic material. Ceramic plates 41~44 are polarized in their direction of thickness. Further, the thickness of each of ceramic plates is 15 μm.

Individual electrodes 35 are formed on an upper face of ceramic plate 41 at locations directly above pressure chambers 10 of passage unit 4. Individual electrodes 35 are formed from Ag—Pd metal. Further, as shown in FIG. 7(*b*), Individual electrodes 35 are substantially diamond shaped, and one portion thereof extends outwards. Land 36 is formed at this extending portion. Lands 36 are circular, have a diameter of approximately 160 μm, and are composed of gold that contains glass flit. Lands 36 are electrically connected with wiring pattern of FPC 50 (to be described).

Common electrode 34 is formed across approximately the entire face between ceramic plate 41 and ceramic plate 42. Common electrode 34 is grounded at a location not shown in the figures. Common electrode 34 is formed from Ag—Pd metal.

Figure 4:
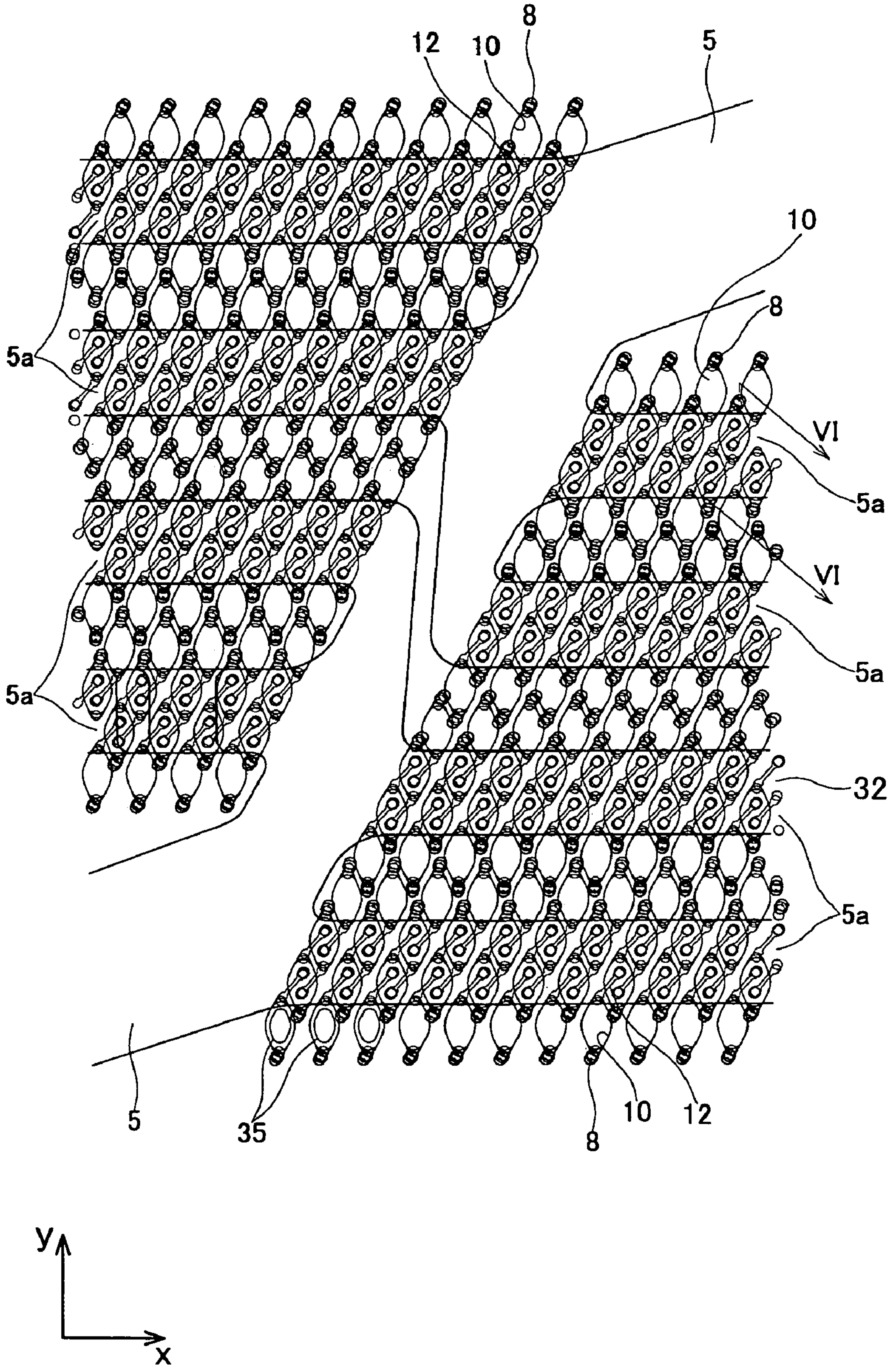
FIG. 4 shows an expanded view of a region A of FIG. 3.

FIG. 4 shows an expanded view of a passage of a region A of FIG. 3. The passage within passage unit 4 is shown by a solid line. As shown in FIG. 4, a plurality of branching passages 32 is formed within passage unit 4. These branching passages 32 extend from sub-manifolds **5*a* to nozzles 8 via apertures 12 and pressure chambers 10. Branching passages 32 are formed in a matrix shape. Manifolds 5 and sub-manifolds 5*a* are formed within passage unit 4 for supplying ink to matrix-shaped branching passages 32. Further, the reference numbers 35 in FIG. 4 represent individual electrodes 35 of actuator units 21. That is, individual electrodes 35 are formed at locations directly above each pressure chambers 10 on an upper face of actuator unit 21. In order for this to be shown more clearly, only some of individual electrodes 35 have been shown in FIG. 4. However, individual electrodes 35 are actually formed directly above all pressure chambers 10**.

One actuator is formed from one individual electrode 35, portion of ceramic plates 41, 42, 43, and 44 facing individual electrode 35, and common electrode 34 facing individual electrode 35. Each actuator unit 21 includes a plurality of actuators.

As shown in FIG. 2, each of wirings 90 has FPC 50 (Flexible Printed Circuit), driver IC 80, base 81, and heat sink 82. FPC 50 is disposed along holder 72 via resilient member 83 such as a sponge or the like. A lower edge of FPC 50 extends into a space formed between lower face 73 of base block 71 and the upper face of ink jet head 70, and is fixed to the upper face of ink jet head 70. More precisely, the lower edge of FPC 50 is fixed to the upper face of actuator unit 21. A plurality of wirings are formed in FPC 50, and a terminal is formed at a lower edge of each wiring. A plurality of lands 36 is formed on the upper face of actuator unit 21. The distribution pattern of the terminals of FPC 50 is identical with the distribution pattern of lands 36 of actuator unit 21, and when the lower edge of FPC 50 is fixed to the upper face of actuator unit 21, the wirings are connected with corresponding lands 36. Driver IC 80 is disposed part-way along FPC 50. Each output terminal of driver IC 80 is electrically connected with the wiring formed on FPC 50. Heat sink 82 is fixed to a surface of driver IC 80. Heat sink 82 prevents a temperature rise of driver IC 80. Sealing member 84 is provided around heat sink 82 to prevent dust or ink within ink jet head module 1 from entering therein.

Base 81 is fixed to the outer faces of two protruding portions 72*b* of holder 72. Base 81 is electrically connected with the wiring near an upper edge of FPC 50. That is, base 81, driver IC 80 and actuator unit 21 are electrically connected by FPC 50.

When base 81 sends an electrical signal to driver IC 80, this causes driver IC 80 to send an electrical signal to actuator unit 21. Actuator unit 21 is driven by the electrical signal sent from driver IC 80. Driver IC 80 selects the wiring that will carry current, and selects individual electrodes 35 to which electric potential will be applied.

The operation of ink jet head module 1 at the time of printing will now be described. During printing, the paper is conveyed in a secondary scanning direction (the y direction in FIG. 1) by the ink jet printer. The paper passes under a lower face of ink jet head module 1. The length of ink jet head module 1 is identical with the width of the paper. Based on the information of the design to be printed, the ink jet printer selects individual electrodes 35 to which electric potential will be applied, and controls the timing at which the electric potential will be applied. For the former case, the nozzles from which ink will be discharged are selected and thereby the points at which the ink will be discharged are selected with respect to the widthwise direction of the paper. For the latter case, the points at which the ink will be discharged are selected with respect to the lengthwise direction of the paper. Specifically, an electrical signal is sent from base 81 to driver IC 80. Driver IC 80 sends an electrical signal to individual electrodes 35 of actuator unit 21 based on the electrical signal that has been received. The signal sent by driver IC 80 causes the electric potential of individual electrodes 35 to be positive.

Usually, the electric potential of individual electrodes 35 of actuator unit 21 is maintained at approximately 0 V. Further, common electrode 34 is grounded, and consequently individual electrodes 35 and common electrode 34 have approximately the same electric potential. In the aforementioned process, driver IC 80 causes the electric potential of individual electrodes 35 to be positive, whereupon an electric field is created between individual electrodes 35 and common electrode 34. Further, ceramic plates 41~44 are formed from ferroelectric material, and the direction of polarization thereof is the direction of thickness of ceramic plates 41~44. As a result, the direction of the electric field created between individual electrodes 35 and the common electrode 34 is parallel with the direction of polarization of ceramic plate 41. Consequently, electrostriction effects caused by the electric field cause ceramic plate 41 to contract in a direction at a right angle to its direction of polarization. By contrast, ceramic plates 42~44 are not affected by the electric field, and consequently do not contract spontaneously. Ceramic plates 41~44 thus deform so as to protrude toward passage unit 4 (unimorph deformation) at the area surrounding individual electrode 35 to which the electric potential has been applied. When the actuator deforms, the volume decreases of pressure chamber 10 that corresponds thereto. When the volume of pressure chamber 10 decreases, the pressure of the ink increases within the pressure chamber 10, and this ink is discharged onto the paper from nozzle 8 that communicates with this pressure chamber.

Driver IC 80 returns individual electrode 35 to its original electric potential, whereupon the electric field that was created between individual electrode 35 and common electrode 34 is eliminated. When the electric field is eliminated, ceramic plate 41 that had contracted returns to its original state, and then the actuator that had deformed so as to protrude toward passage unit 4 returns to its original state. Thereupon, the volume of pressure chamber 10 corresponding thereto returns to its original state, whereupon ink is attracted into pressure chamber 10 from branching passage 32 at aperture 12 side that corresponds thereto, and pressure chamber 10 is thus refilled.

As described above, driver IC 80 selects individual electrodes 35 and sends the electrical signal to selected individual electrodes 35, thus causing the ink to be discharged from selected nozzles 8 that correspond to selected individual electrode 35. Driver IC 80 sends the electrical signals to selected individual electrodes 35 with the requisite timing based on the information of the design to be printed and on the position information of ink jet head module 1. As a result, ink is discharged with the requisite timing from selected nozzles 8, and the design is printed.

Next, a method of manufacturing ink jet head 70 of the present embodiment will be described with reference to FIG. 8.

In S10, the penetrating holes are formed in all of metal plates 22~30 (this including top metal plate 22 and nozzle plate 30 that forms the bottom metal plate) for forming passage unit 4. The penetrating holes are formed by etching. Further, the water-repellent layer is formed on the lower face of nozzle plate 30.

In S11, of metal plates 22~30 that have had the penetrating holes formed therein, metal plates 23~29 are stacked together to form a stack. Top metal plate 22 and the bottom metal plate 30 (the nozzle plate) are not included in this stack. The stack of metal plates 23~29 are heated under pressure. Then, adjacent metal plates are bonded together by metal diffusion bonding, thus unifying the stack. FIG. 9 is an explanatory view showing S11 of FIG. 8. As shown in FIG. 9, metal plates 23~29 are stacked and are then gripped between a pair of pressing jigs 62 and 63 formed within a furnace. Once metal plates 23~29 are gripped between pressing jigs 62 and 63, pressure within the furnace is reduced and an approximate vacuum state is formed. Thereupon, the furnace is heated to about 1000° C. while pressure is being applied to metal plates 23~29 between pressing jigs 62 and 63. Metal plates 23~29 are maintained for a constant time in this state of being heated under pressure, thus causing the metal diffusion bonding of the adjacent metal plates of metal plates 23~29. Once the metal diffusion bonding of metal plates 23~29 has been performed, incomplete passage unit 60 has been manufactured.

Figure 8:
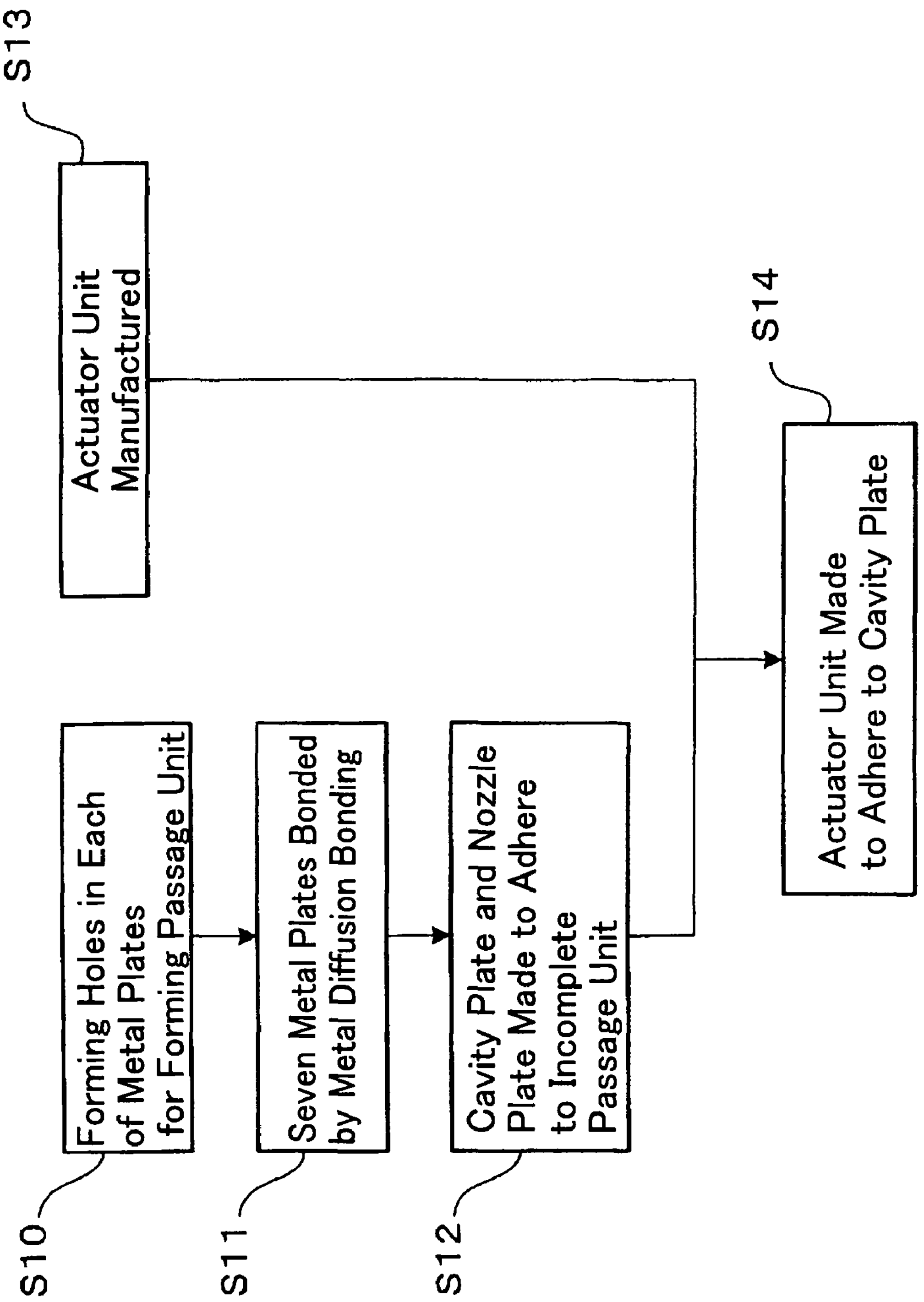
FIG. 8 shows steps for manufacturing the ink jet head of the first embodiment.
Figure 9:
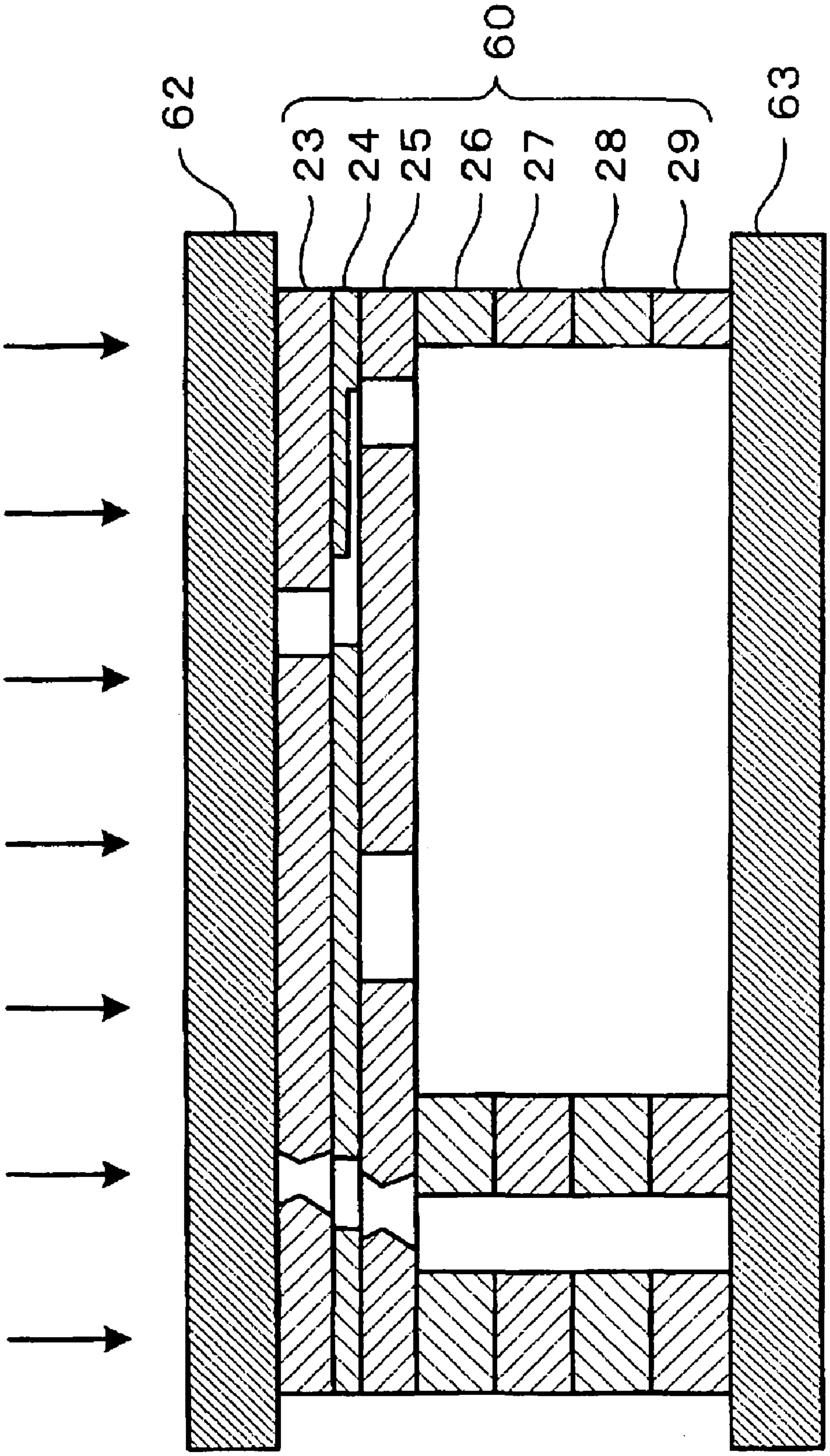
FIG. 9 is an explanatory view showing a metal diffusion bonding step.

In S12 of FIG. 8, top metal plate 22 (the cavity plate) and bottom metal plate 30 (the nozzle plate) are caused to adhere by means of adhesive to incomplete passage unit 60. That is, a lower face of top metal plate 22 is caused to adhere to an upper face of metal plate 23, and an upper face of bottom metal plate 30 is caused to adhere to a lower face of metal plate 29. Passage unit 4 is thus completed.

In S13 of FIG. 8, actuator unit 21 is manufactured by being baked. That is, individual electrodes 35 are formed on an upper face of a green sheet that is the material of ceramic plate 41, and common electrode 34 is formed on a lower face of the green sheet. When individual electrodes 35 and common electrode 34 have been formed on the green sheet that is the material of ceramic plate 41, this green sheet and green sheets that form the material of ceramic plates 42~44 are stacked. When the green sheets have been stacked, these green sheets are heated, and are maintained in the heated state for a constant time. The green sheets that have been hardened by baking form ceramic plates 41~44. Further, ceramic plates 41~44 each bond with the adjacent ceramic plates, thereby completing actuator unit 21.

In S14 of FIG. 8, four completed actuator units 21 are caused by means of adhesive to adhere to completed passage unit 4. That is, lower faces of actuator units 21 are caused to adhere to the upper face of passage unit 4. When actuator units 21 have been caused to adhere to passage unit 4, ink jet head 70 is complete.

With the aforementioned manufacturing method, top metal plate 22 is caused by means of adhesive to adhere to metal plate 23 at the upper side of incomplete passage unit 60. That is, there is no metal diffusion bonding of top metal plate 22, and consequently warping thereof does not occur. When there is no warping of top metal plate 22, actuator units 21 can, by being adhered, be made to fit in a uniform manner with top metal plate 22, and consequently a uniform amount of ink is discharged from nozzles 8. As a result, high quality printing is possible.

As described above, the water-repellent layer of nozzle plate 30 is readily affected by heat, and consequently this water-repellent layer would be damaged if nozzle plate 30 were heated at the time of metal diffusion bonding. However, with the aforementioned manufacturing method, nozzle plate 30 does not undergo metal diffusion bonding. Since nozzle plate 30 is not heated, there is no damage to the water-repellent layer formed on the lower face of nozzle plate 30.

A complicated step is usually required to form the water-repellent layer on the completed ink jet head. In the present embodiment, after the water-repellent layer has been formed on the lower face of nozzle plate 30, and consequently complicated steps are not required to complete inkjet head 70. It is relatively easy to form the water-repellent layer on nozzle plate 30 that exists as a single unit.

The manufacturing method of the present embodiment can be used in manufacturing a passage unit comprising a vibrating plate. Below, ink jet head 101 of a second embodiment will be described. Parts that have the same configuration as the first embodiment have the same reference numbers applied thereto, and a description thereof will be omitted where appropriate.

Figure 10:
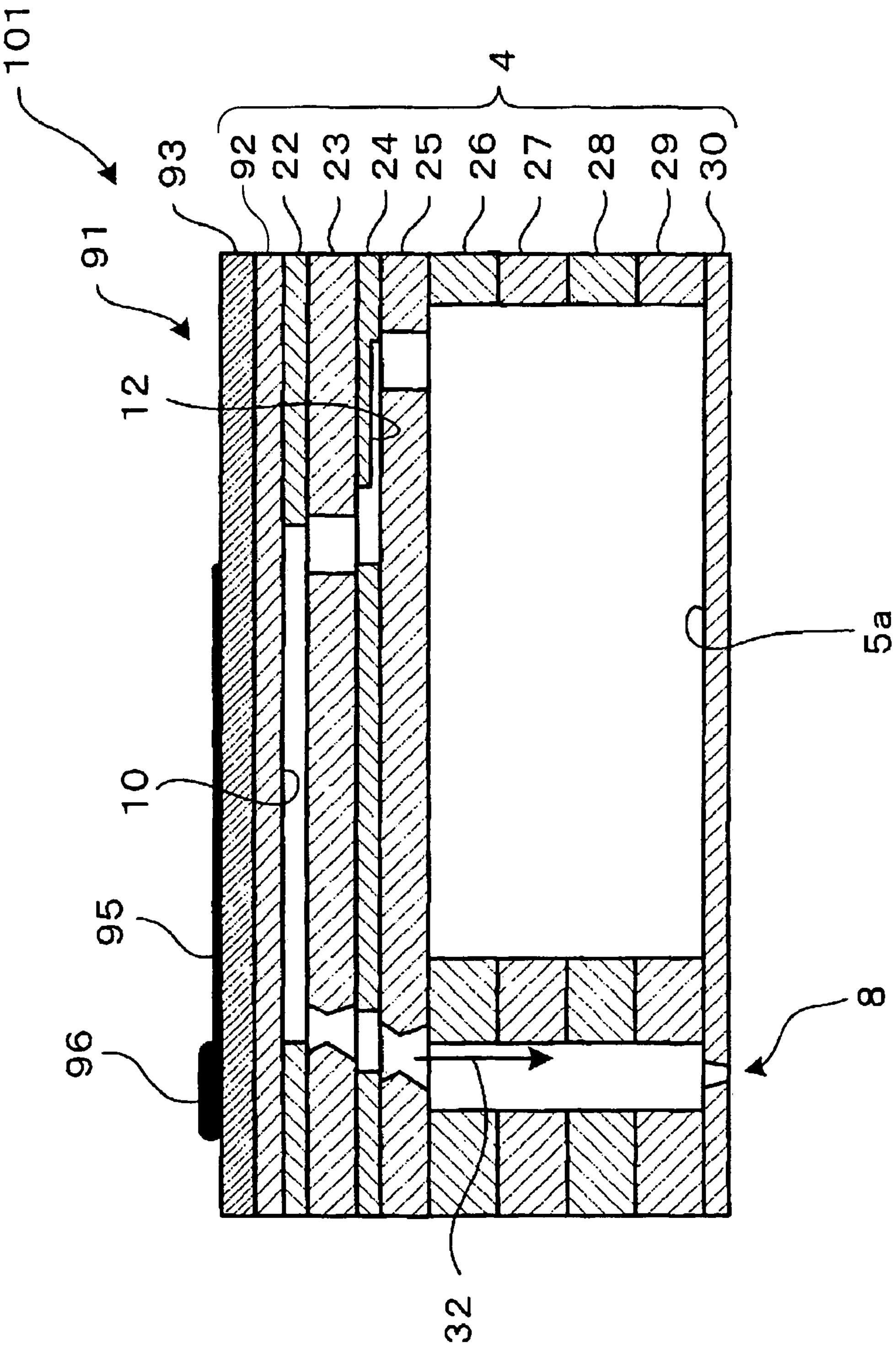
FIG. 10 is a cross-sectional view equivalent to FIG. 6 of an ink jet head of a second embodiment.

As shown in FIG. 10, ink jet head 101 of the second embodiment also consists of passage unit 4 and actuator unit 91.

Passage unit 4 of the second embodiment is a stacked structure comprising vibrating plate 92 and metal plates 22~30. Like the first embodiment, passages are formed within passage unit 4 from metal plates 22~29 and nozzle plate 30. In passage unit 4 of the second embodiment, openings of pressure chambers 10 formed in metal plate 22 are covered by vibrating plate 92. Actuator unit 91 is fixed to an upper face of vibrating plate 92.

Vibrating plate 92 is a thin metal (stainless steel) plate that readily deforms when an actuator deforms. Vibrating plate 92 does not intervene with the phenomenon of the pressure change in pressure chamber 10 caused by the deformation of the actuator. Vibrating plate 92 is the top metal plate of passage unit 4 of the second embodiment.

Vibrating plate 92 is grounded at a location not shown in the figures. Further, although this is not shown, penetrating holes are formed in vibrating plate 92, these penetrating holes communicating with ink reservoirs 3 and manifolds 5.

Actuator unit 91 is a structure in which individual electrodes 95 are formed on an upper face of ceramic plate 93. As in the first embodiment, individual electrodes 95 are formed directly above pressure chambers 10. Further, one portion of each of individual electrodes 95 extends outwards, and land 96 is formed at each of these extending portions.

With ink jet head 101 of the second embodiment, vibrating plate 44 operates as a common electrode. When individual electrode 95 is caused to have an electric potential positive, an electric field created between individual electrode 95 and vibrating plate 44 causes ceramic plate 93 to contract in a direction at a right angle to its direction of polarization. By contrast, vibrating plate 44 does not contract spontaneously. Thereupon, ceramic plate 93 and vibrating plate 44 deform, in the area surrounding individual electrode 95 to which the positive electric potential has been applied, so as to protrude toward pressure chamber 10. The volume of pressure chamber 10 thus decreases. When the volume of pressure chamber 10 decreases, the pressure of the ink within pressure chamber 10 increases, and this ink is discharged onto the paper from nozzle 8. Consequently, as in the first embodiment, the design can be printed on the paper. In this case, as well, one actuator is formed by individual electrode 95, ceramic plate 93 in the area facing individual electrode 95, and vibrating plate 44 of this same area. Actuator unit 91 is provided with the same number of actuators as the number of pressure chambers 10.

The operation of ink jet head 101 at the time of printing will now be described. At the time of printing, driver IC 80 sends an electrical signal to selected individual electrodes 95. This electrical signal causes the electric potential of selected individual electrodes 95 to be positive.

Usually, the electric potential of individual electrodes 95 is maintained at approximately 0 V. Further, vibrating plate 92 is grounded, and consequently individual electrodes 95 and vibrating plate 92 have approximately the same electric potential. When driver IC 80 causes the electric potential of selected individual electrodes 95 to be positive, an electric field is created between selected individual electrodes 95 and vibrating plate 92. Thereupon, electrostriction effects caused by the electric field cause ceramic plate 93 to contract in a direction at a right angle to its direction of polarization. By contrast, vibrating plate 92 does not contract spontaneously. Actuator unit 91 and vibrating plate 92 therefore deform (unimorph deformation), in the area surrounding selected individual electrode 95 to which the positive electric potential has been applied, so as to protrude toward pressure chamber 10. When vibrating plate 92 deforms, the volume of pressure chamber 10 decreases, the pressure of the ink within pressure chamber 10 increases, and this ink is discharged onto the paper from nozzle 8.

Driver IC 80 returns individual electrode 95 to its original electric potential, whereupon actuator unit 91 and vibrating plate 92 return to their original state. Thereupon, the volume of pressure chamber 10 returns to its original state, and consequently pressure chamber 10 is refilled with ink.

As with ink jet head 70 of first embodiment, ink jet head 101 of the second embodiment allows the paper to printed.

Next, steps for manufacturing ink jet head 101 will be described with reference to FIG. 11.

In S20, the penetrating holes are formed in all of the metal plates for forming passage unit 4, i.e. vibrating plate 92, metal plates 22~29, and nozzle plate 30. The penetrating holes are formed by etching. Further, a water-repellent layer is formed on a lower face of nozzle plate 30.

Figure 12:
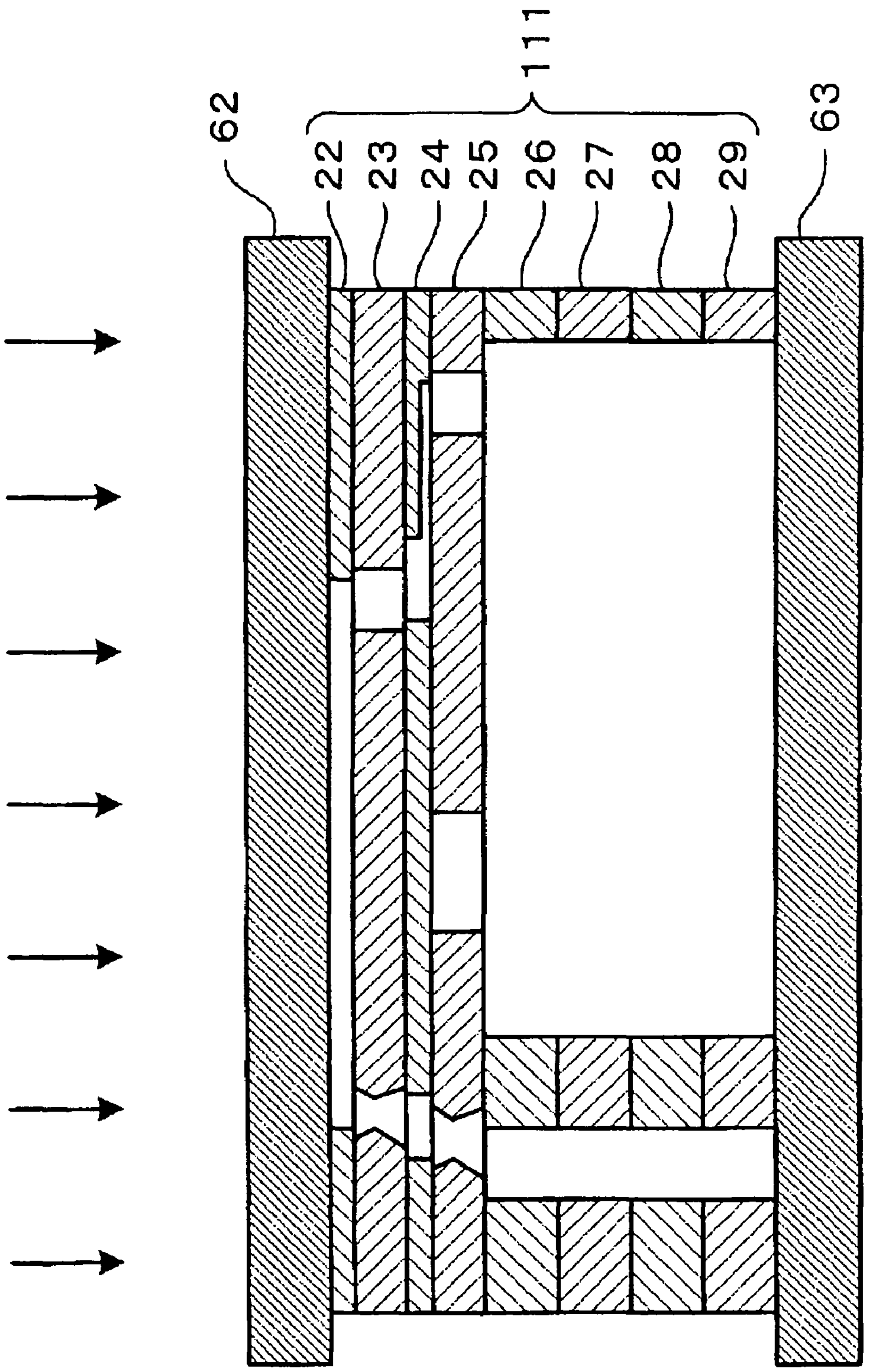
FIG. 12 is an explanatory view showing a metal diffusion bonding step of the second embodiment.

In S21, eight metal plates 22~29 are stacked together to form a stack. Top metal plate 92 (the vibrating plate) and bottom metal plate 30 (the nozzle plate) are not included in this stack. The stack of eight metal plates 22~29 are bonded together by metal diffusion bonding. FIG. 12 is an explanatory view showing S21. As shown in FIG. 12, metal plates 22~29 are stacked and are then gripped between a pair of pressing jigs 62 and 63 formed within a furnace. Once metal plates 22~29 are gripped between pressing jigs 62 and 63, pressure within the furnace is reduced and an approximate vacuum state is formed. Thereupon, the furnace is heated to about 1000° C. while pressure is being applied to metal plates 22~29 between pressing jigs 62 and 63. Metal plates 22~29 are maintained for a constant time in this state of being heated under pressure, thus causing the metal diffusion bonding of adjacent metal plates 22~29. Incomplete passage unit 111 is thus manufactured.

Figure 11:
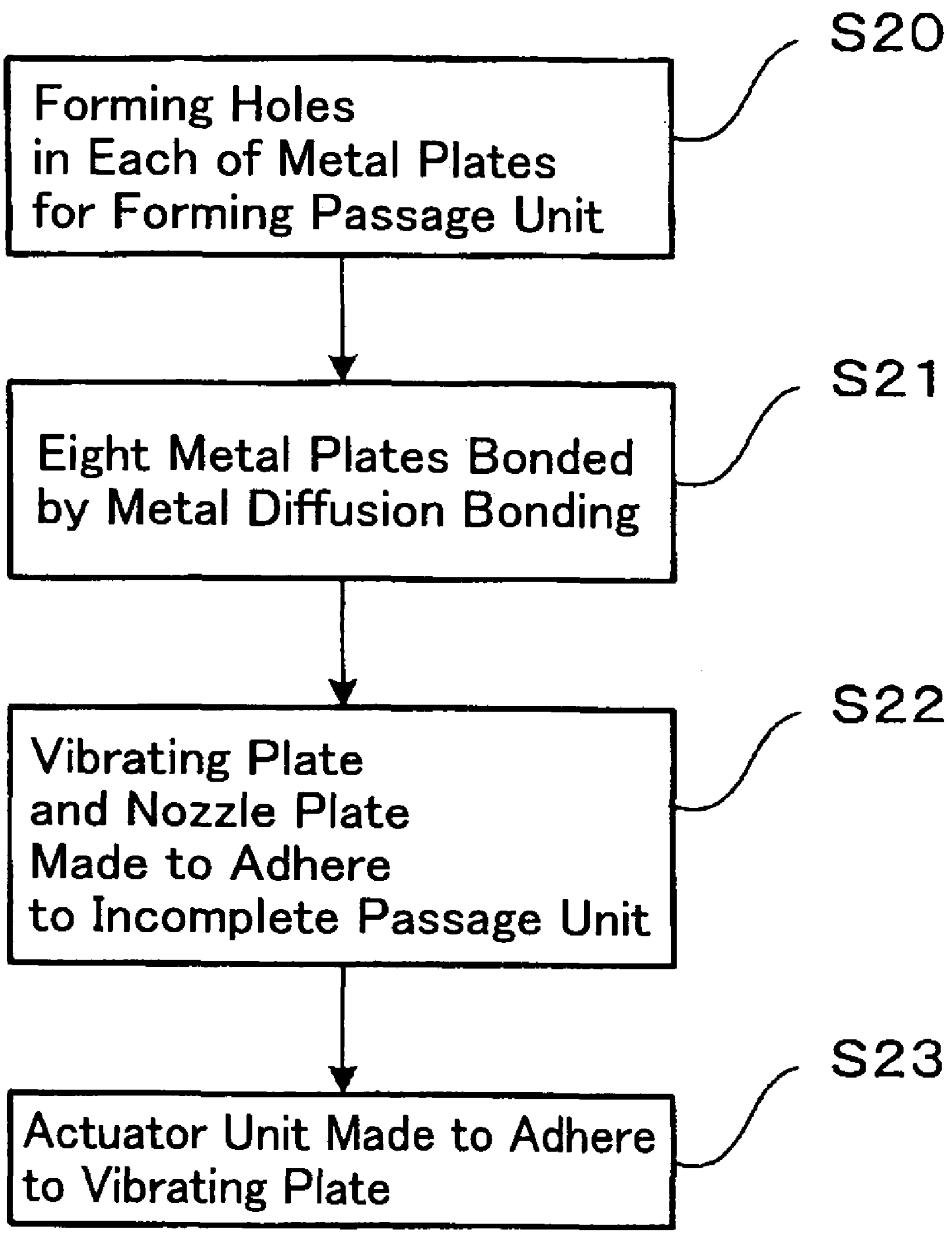
FIG. 11 shows steps for manufacturing the ink jet head of the second embodiment.

In S22 of FIG. 11, vibrating plate 92 and nozzle plate 30 are caused to adhere by means of adhesive to incomplete passage unit 111. That is, a lower face of vibrating plate 92 is caused to adhere to an upper face of metal plate 22, and an upper face of nozzle plate 30 is caused to adhere to a lower face of metal plate 29. Passage unit 4 is thus completed.

In S23 of FIG. 11, actuator units 91 that have already been produced are caused by means of adhesive to adhere to top metal plate 92 (the vibrating plate) of passage unit 4. That is, lower faces of actuator units 91 are caused to adhere to the upper face of passage unit 4. When actuator units 91 have been caused to adhere to passage unit 4, ink jet head 101 is complete.

With the aforementioned manufacturing method, vibrating plate 92 is caused by means of adhesive to adhere to adjacent metal plate 22. That is, there is no metal diffusion bonding of vibrating plate 92, and consequently warping thereof does not occur. When there is no warping of vibrating plate 92, actuator units 91 can be made to fit in a uniform manner with vibrating plate 92, and consequently a uniform amount of ink is discharged from nozzles 8. As a result, high quality printing is possible.

Further, with the aforementioned manufacturing method, there is no metal diffusion bonding of nozzle plate 30. That is, since nozzle plate 30 is not heated, there is no damage to the water-repellent layer formed on the lower face of nozzle plate 30.

Representative embodiments have been described above. However, the present invention is not restricted to the embodiments described above. Various improvements and transformations are possible without deviating from the purpose of the present invention.

For example, in the above embodiments, the top metal plate and the actuator unit were caused to adhere to the incomplete passage unit in separate steps. However, the top metal plate and the actuator unit may equally well be made to adhere simultaneously. With this type of manufacturing method, the ink jet head can be manufactured more efficiently.

In the above embodiments, the nozzle plate was caused to adhere by means of adhesive. However, the nozzle plate may equally well undergo metal diffusion bonding together with the other metal plates. In the case where the water-repellent layer is not formed on the nozzle plate, there is no problem in the nozzle plate undergoing metal diffusion bonding.

Further, in the above embodiments, all of the metal plates were bonded by metal diffusion bonding with the exception of the top metal plate and the bottom metal plate. However, this manufacturing method is not necessarily required. For example, if the second from top metal plate is bonded by metal diffusion bonding and there is warping of this metal plate, thus causing warping of the top metal plate located above this plate, the second from top metal plate and the top metal plate may be caused to adhere by means of adhesive to the incomplete passage unit that was manufactured using metal diffusion bonding. In this case, both the second from top metal plate and the top metal plate can be assessed as the top metal plate.

In the above embodiments, the actuator unit deformed so as to protrude toward the pressure chamber when the electrical signal was sent to the individual electrode. However, the actuator unit may equally well protrude away from the pressure chamber. With this type of configuration, as well, the ink can be discharged from the nozzle.

In the above embodiments, the individual electrodes were formed on the upper face of the actuator unit. However, the individual electrodes may equally well be formed within the actuator unit, and the common electrode may be formed on the upper face of the actuator unit. With this type of configuration, as well, the actuators within the actuator unit can be made to deform independently by sending the electrical signals to the individual electrodes.

In the above embodiments, a description was given of an actuator that increases the pressure within the pressure chamber by means of deforming. However, the actuator may equally well be an actuator that increases this pressure by heating the ink within the pressure chamber.

As described above, in one form of a manufacturing method of the ink jet head of the present invention, the top metal plate made to adhere to the incomplete passage unit is a vibrating plate. The vibrating plate is a metal plate that vibrates while the actuator unit is activated.

In one form of a manufacturing method of the ink jet head of the present invention, the top metal plate made to adhere to the incomplete passage unit is the cavity plate. A plurality of penetrating holes are formed in the cavity plate, and these penetrating holes are covered by the actuator unit.

In one form of a manufacturing method of the ink jet head of the present invention, the bottom metal plate made to adhere to the incomplete passage unit is the nozzle plate. The nozzle plate has a plurality of penetrating holes that comprise the nozzles formed therein.

What is claimed is:

1. A method of manufacturing an ink head, comprising steps of:

preparing a stack of a plurality of metal plates;

heating the stack under pressure to bond the plurality of metal plates and produce an incomplete passage unit;

causing a first surface of a top metal plate to adhere to the incomplete passage unit by means of an adhesive to complete a passage unit from the incomplete passage unit, wherein penetrating holes which penetrate the top metal plate from the first surface to a second surface of the top metal plate are formed within the top metal plate, wherein the second surface is opposite the first surface, and the penetrating holes form pressure chambers when the top metal plate has been adhered to the incomplete passage unit, and the passage unit comprises a passage including the pressure chambers and is configured to pass ink therethrough; and fixing an actuator unit to the second surface of the top metal plate of the completed passage unit, such that the penetrating holes are covered by the actuator unit, wherein the actuator unit deforms to change pressure within the pressure chambers.

2. A method of manufacturing an ink jet head as defined in claim 1, wherein causing the first surface of the top metal plate to adhere to the incomplete passage unit and fixing the actuator unit to the second surface of the top metal plate are performed simultaneously.

3. A method of manufacturing an ink jet head as defined in claim 1, wherein the top metal plate is a vibrating plate that vibrates while the actuator unit is activated.

4. A method of manufacturing an ink jet head as defined in claim 1, further comprising a step of:

causing a bottom metal plate to adhere to the incomplete passage unit by means of an adhesive, the bottom metal plate having a plurality of penetrating holes for forming a plurality of nozzles.

5. A method of manufacturing an ink jet head as defined in claim 4, wherein a bottom surface of the bottom metal plate is covered with a water-repellent layer.

* * * * *